(12) United States Patent
Zheng et al.

(10) Patent No.: US 6,331,803 B1
(45) Date of Patent: Dec. 18, 2001

(54) CONSTANT BANDWIDTH, VARIABLE GAIN AMPLIFIER, AND METHOD

(75) Inventors: Zhiliang Zheng, San Jose; Steven C. Lam, Cupertino, both of CA (US)

(73) Assignee: Marvell International Ltd, Hamilton (BE)

( * ) Notice: Subject to any disclaimer, the term of this patent is extended or adjusted under 35 U.S.C. 154(b) by 0 days.

(21) Appl. No.: 09/566,861

(22) Filed: May 8, 2000

(51) Int. Cl.[7] ....................................................... H03F 3/45
(52) U.S. Cl. ................................................ 330/254; 360/46
(58) Field of Search ................................... 330/252, 253, 330/254, 295; 360/46, 67, 68

(56) References Cited

U.S. PATENT DOCUMENTS 5,455,816 * 10/1995 Bitting ............................... 360/46 X
6,011,437    1/2000 Sutardja et al. ....................... 330/254
6,069,866 *  5/2000 Pietruszynski et al. ......... 330/254 X

* cited by examiner

*Primary Examiner*—Steven J. Mottola
(74) *Attorney, Agent, or Firm*—Eric B. Janofsky

(57) ABSTRACT

A multi-stage amplifier having a plurality of switch mechanisms, one for each stage, that are individually controllable to vary the gain of the amplifier without compromising bandwidth. The amplifier may be embodied in a magnetic storage medium magnetic storage medium that includes a preamplifier in which the multi-stage amplifier is embodied.

22 Claims, 7 Drawing Sheets

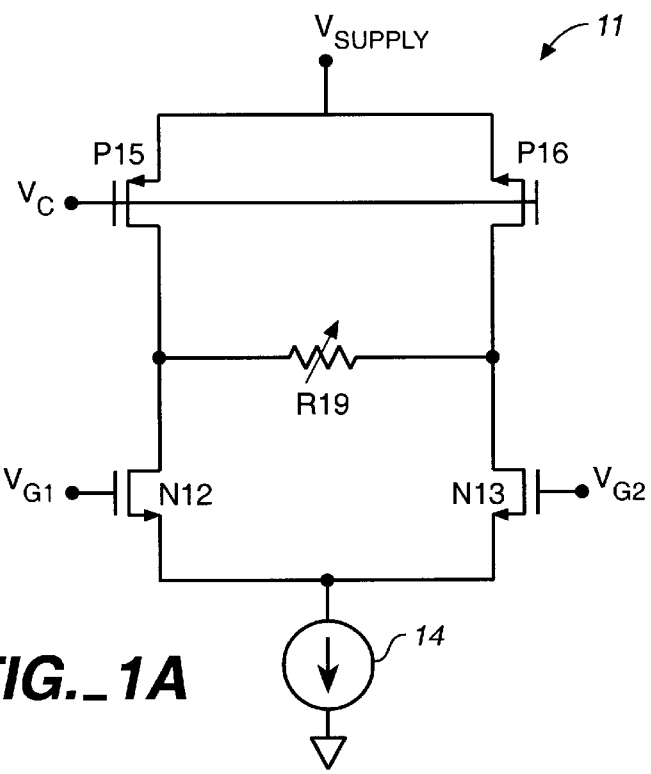
FIG._1A
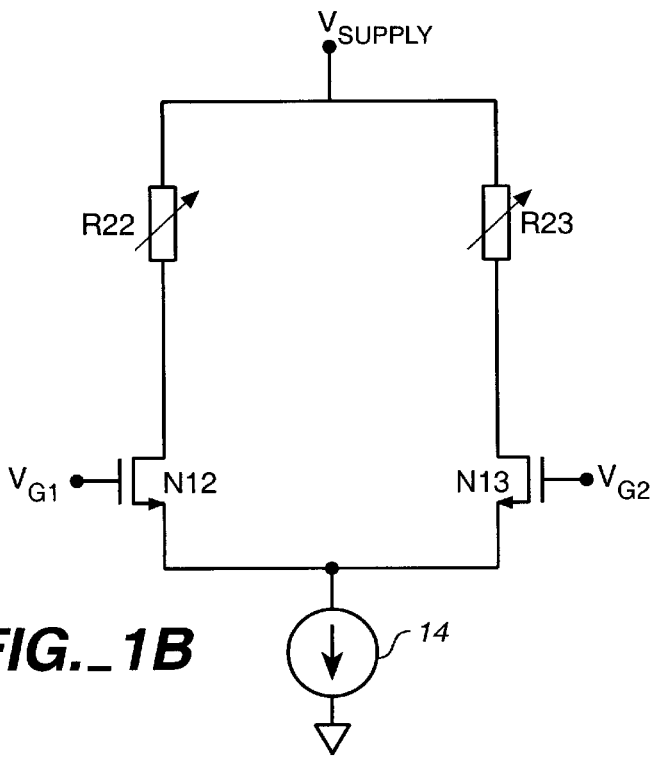
FIG._1B

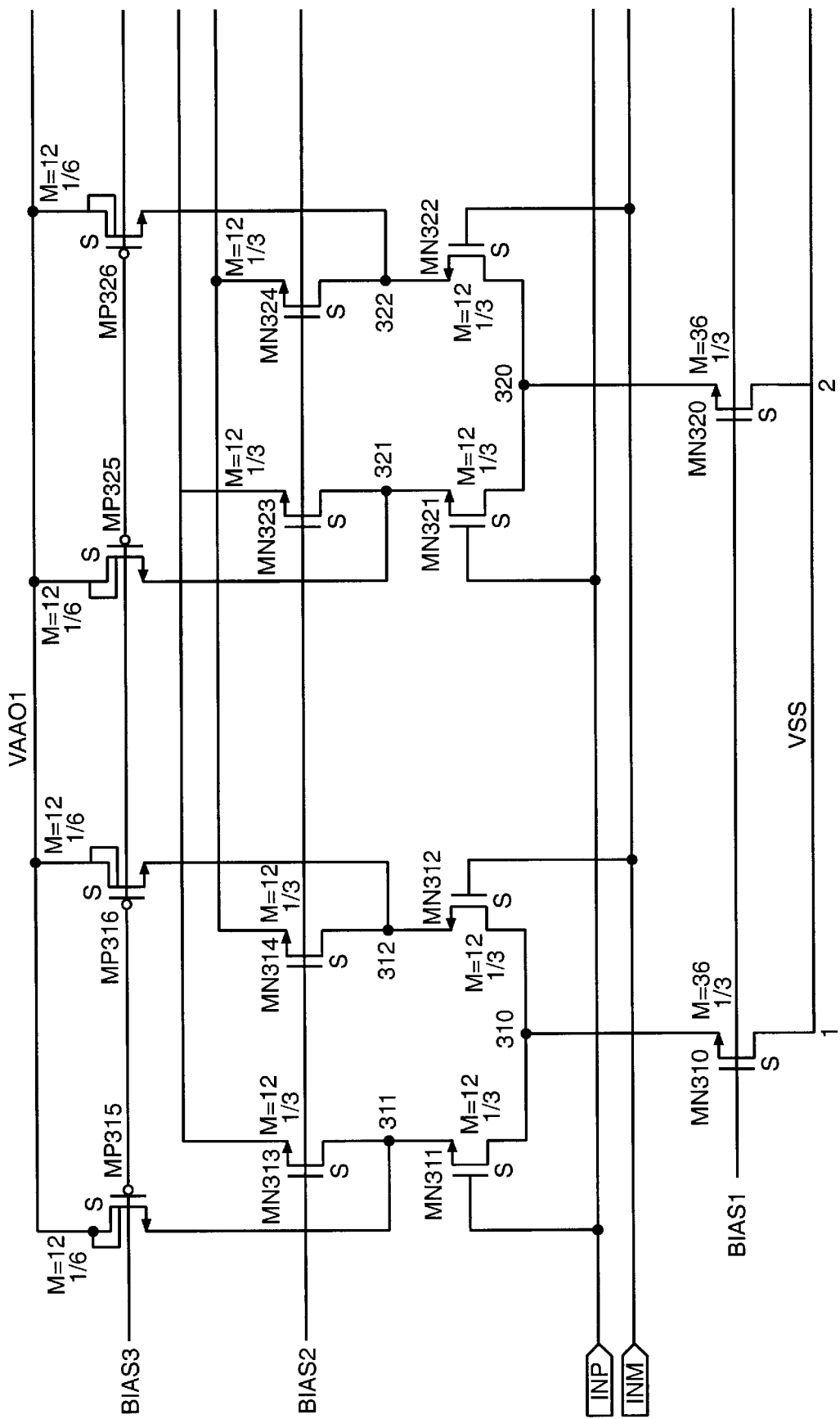
FIG._2A-1

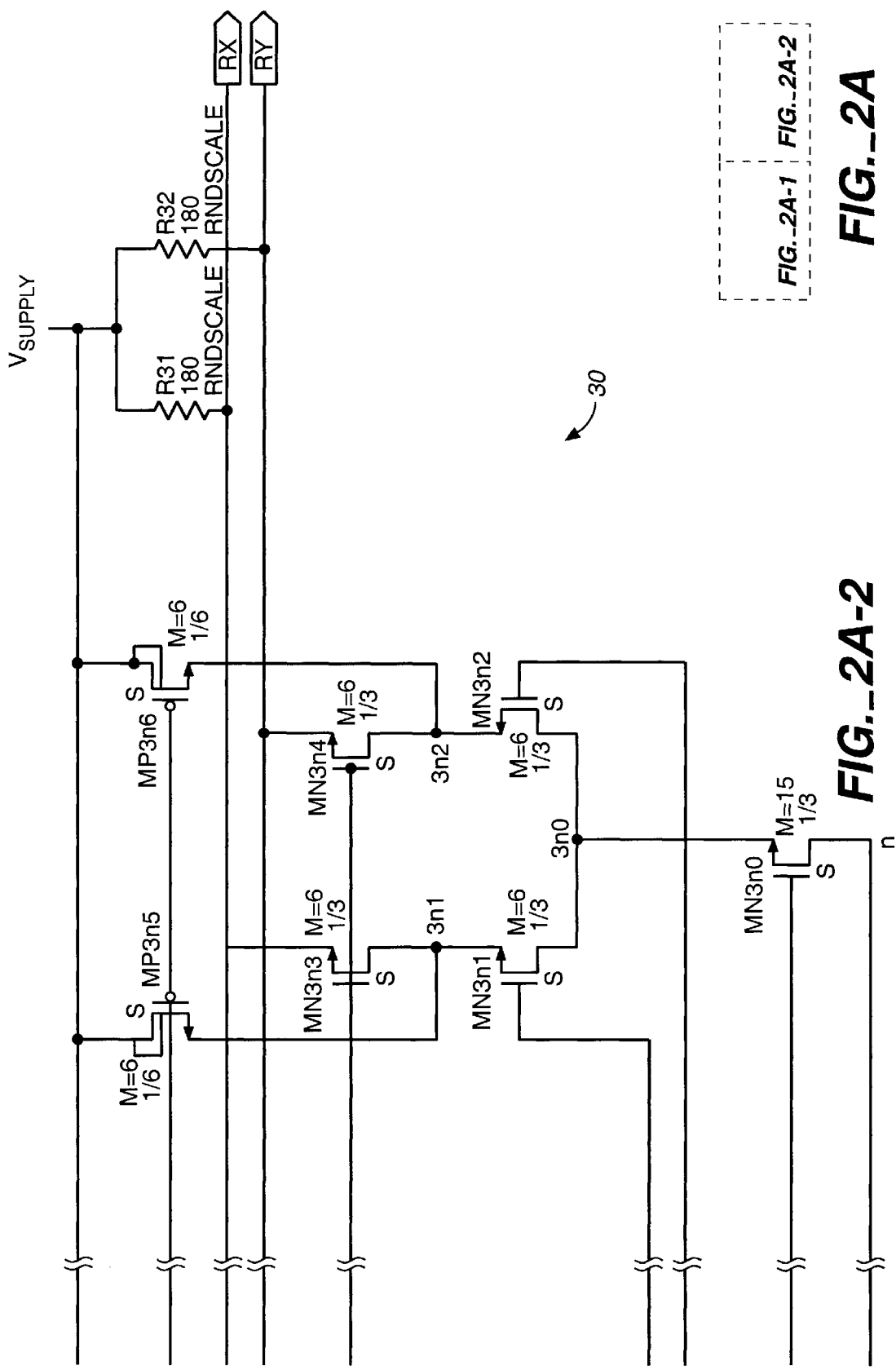
FIG._2A

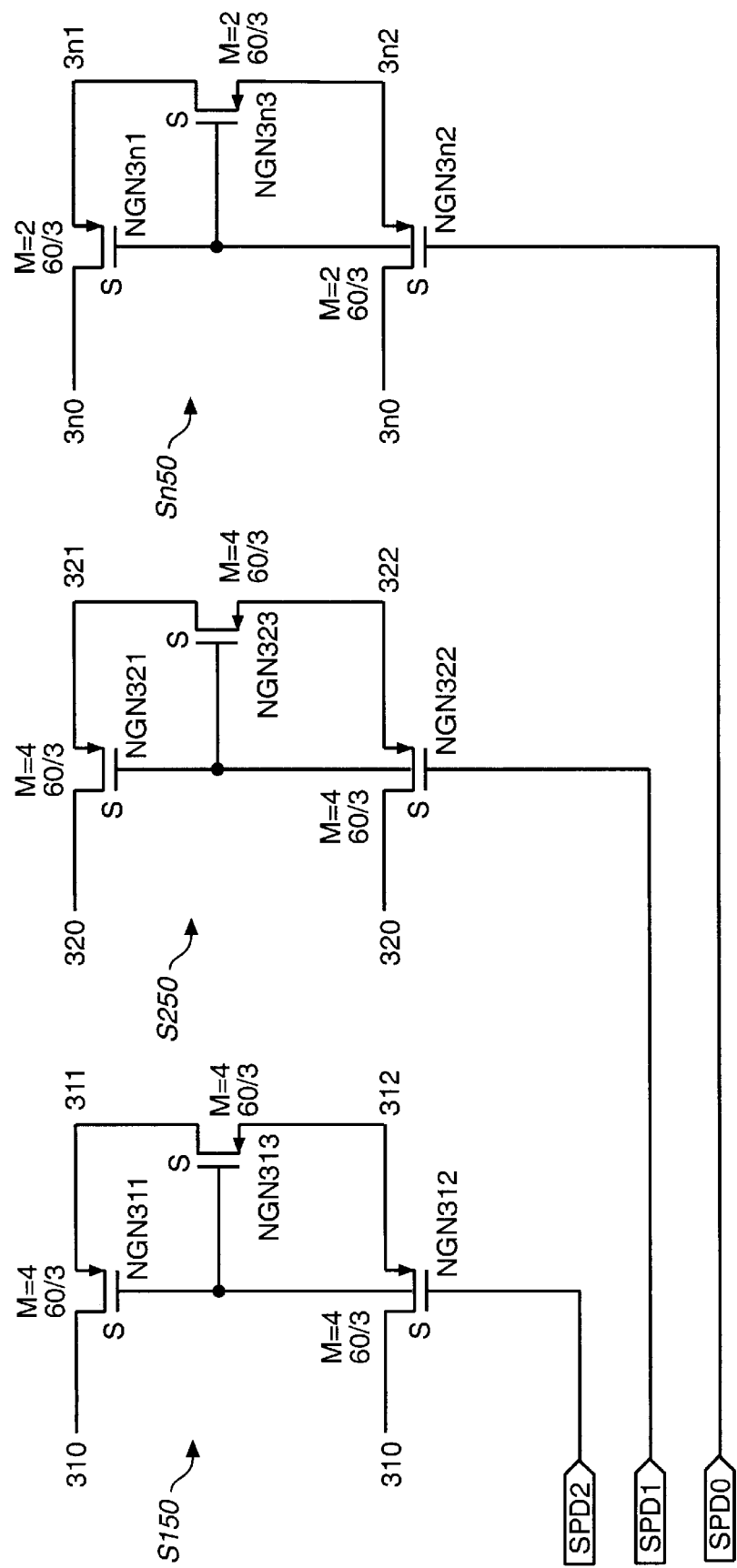
FIG._2B

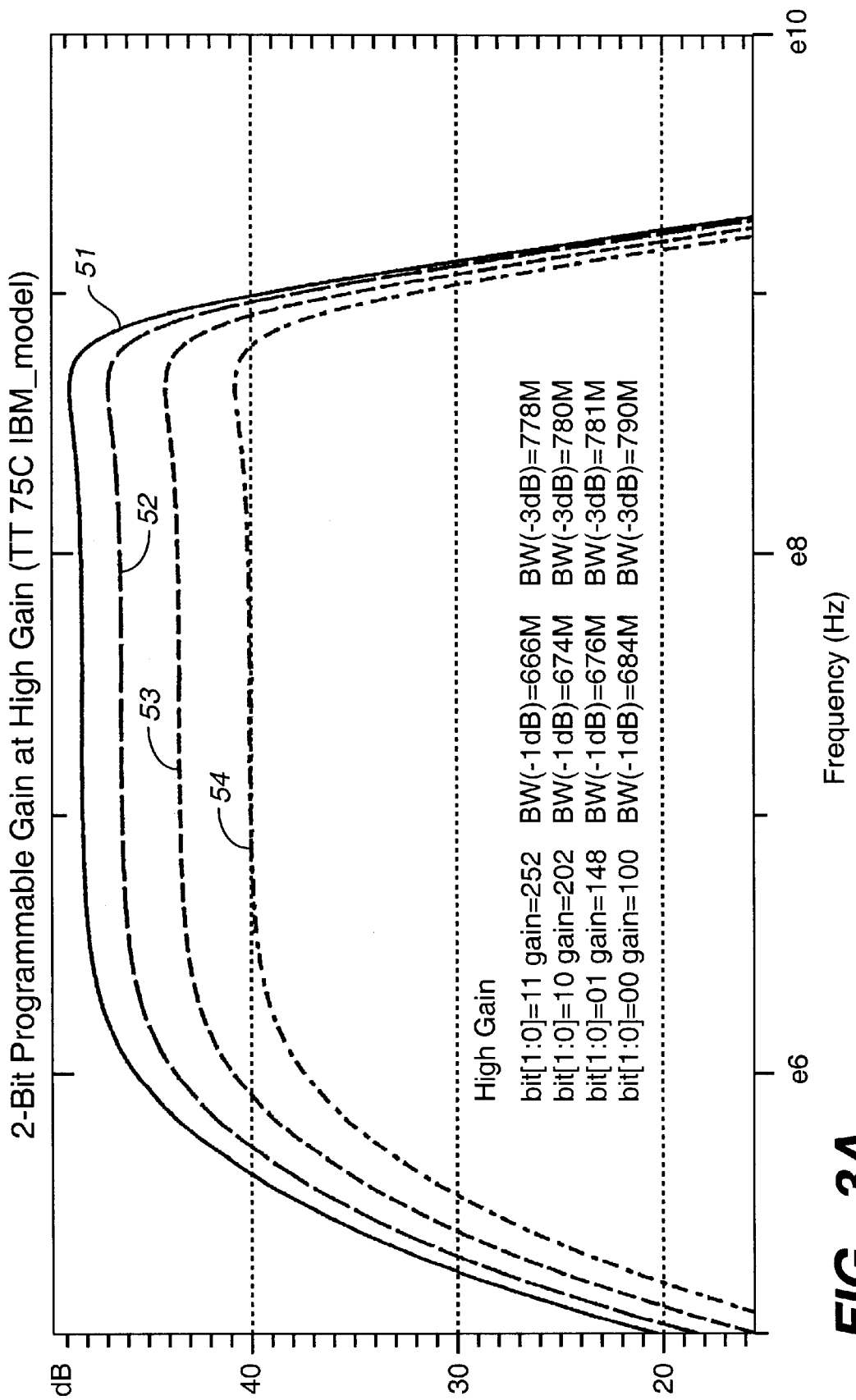
FIG._3A

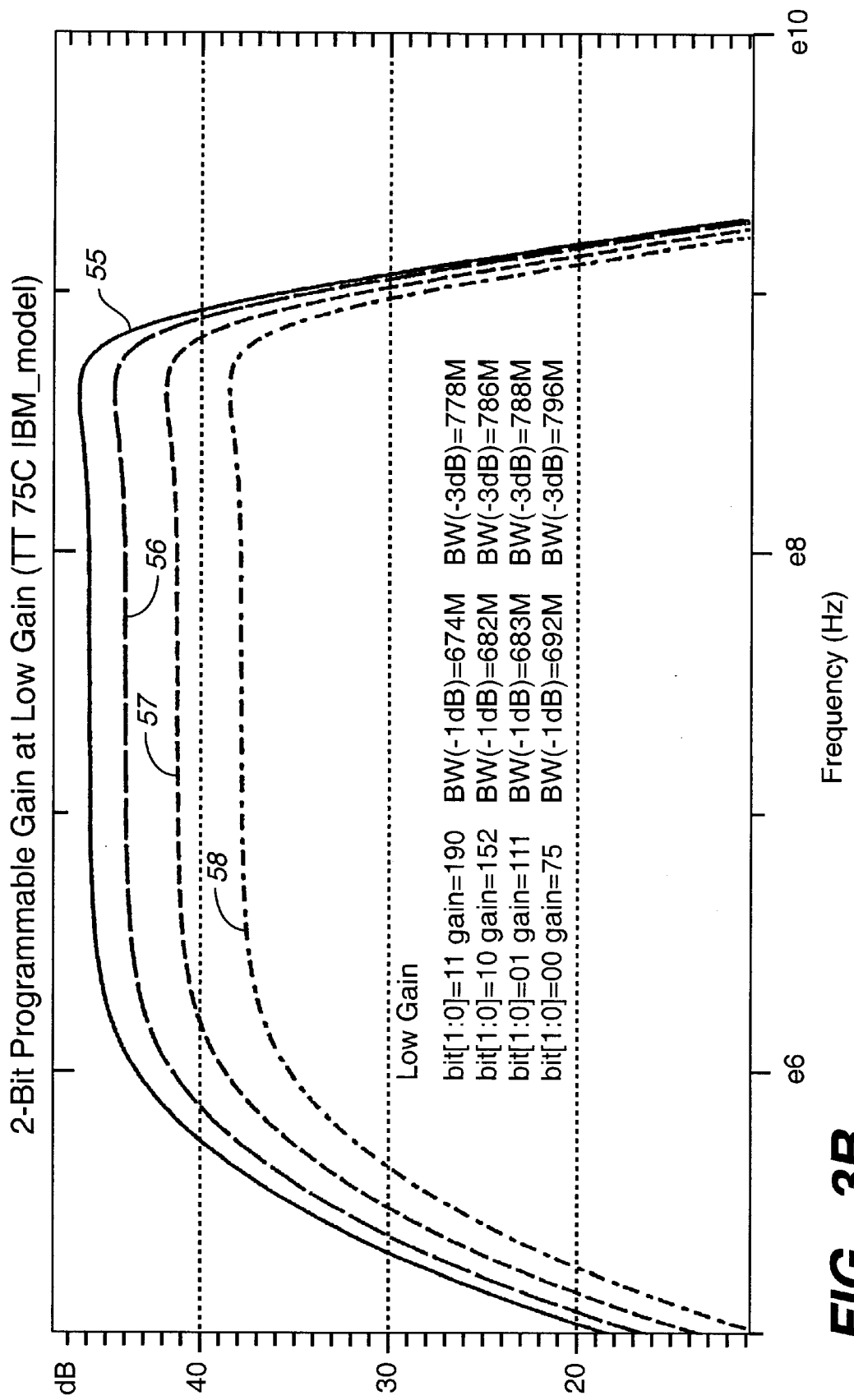
FIG._3B

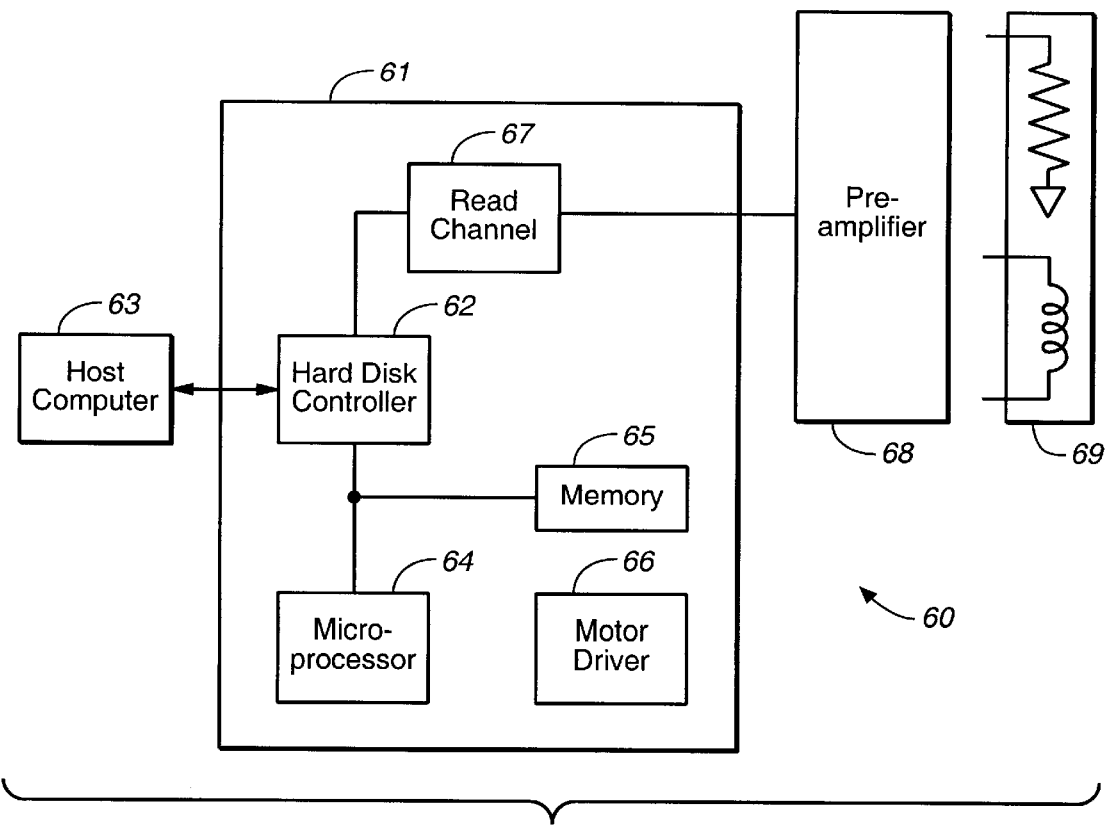
FIG._4A
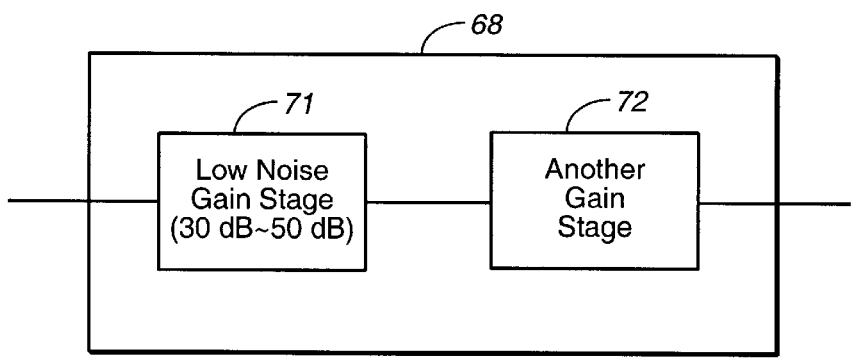
FIG._4B

CONSTANT BANDWIDTH, VARIABLE GAIN AMPLIFIER, AND METHOD

FIELD OF THE INVENTION

The present invention relates to a multi-stage amplifier, and more particularly to a multi-stage amplifier that maintains a substantially constant bandwidth as the gain varies. The invention further relates to a magnetic storage medium that includes a preamplifier in which the multi-stage amplifier is embodied.

BACKGROUND OF THE INVENTION

Known variable voltage gain amplifiers include operational amplifiers of both single- and multi-stage designs. These conventional amplifiers often suffer from such performance limitations as limited dynamic range, distortion in the presence of heavy output loads, and a trade-off between the voltage gain available and the bandwidth over which the amplifier provides a substantially flat voltage gain profile.

FIG. 1A is a schematic diagram of a conventional, single-stage, variable gain amplifier (VGA) 11 comprised of both n-channel and p-channel metal oxide semiconductor field effect transistors (MOSFETs), in accordance with conventional CMOS technology. The amplifier includes a pair of NMOS transistors N12 and N13 for receiving a differential input signal represented by the difference between input signals $v_{G1}$ and $v_{G2}$. The input transistors are biased by a constant current source 14, which is typically implemented with a current mirror configuration. Input transistors N12 and N13 are actively loaded with a pair of PMOS transistors P15 and P16. The drains of P15 and P16 are respectively coupled to the drains of input transistors N12 and N13 to provide a variable load in response to a voltage control signal ($v_c$) applied to the gates of each of the load transistors. A variable resistor R19, coupled between the drains of the input transistors, operates as a bandwidth limited gain control to adjust the gain while varying the bandwidth of the amplified differential output signals which are generated at opposite ends of the resistor.

FIG. 1B illustrates another conventional, single-stage VGA design 21. This design is similar to the design shown in FIG. 1A, except that this design employs a pair of variable resistors R22 and R23 instead of voltage-controlled load transistors. Also, there is no variable resistor coupled between the drains of the input transistors.

A basic problem with conventional amplifiers of the types shown in FIGS. 1A and 1B is that voltage gain is substantially inversely proportional to the bandwidth of the amplifier. In fact, the gain-bandwidth product in such amplifiers remains nearly constant in the operating range of the amplifier. Thus, an increase in gain decreases the bandwidth, and vice-versa. These conventional amplifiers lack the ability to provide a variable gain, while maintaining a substantially constant bandwidth. The amplifier illustrated in FIG. 1B also does not provide a constant common-mode output.

OBJECTS AND SUMMARY OF THE INVENTION

It is therefore an object of the present invention to provide an amplifier that maintains a substantially constant bandwidth, as the gain is adjusted, and a method of forming such an amplifier.

It is another object of this invention to provide a multi-stage, constant bandwidth, variable gain amplifier, where the gain of each stage is individually controllable to control the overall gain of the amplifier without substantially degrading the bandwidth of the amplifier.

It is a further object of this invention to provide a magnetic storage medium including a pre-amplifier in which a variable gain amplifier capable of maintaining substantially constant bandwidth is embodied.

According to one aspect of the invention, an amplifier is provided which comprises a plurality of amplification stages having at least one common output node. Each stage includes a switch mechanism that controls the gain of that stage, wherein the switch mechanisms are selectively controllable to vary the gain of the amplifier while maintaining substantially constant bandwidth.

Preferably, each amplification stage includes a first pair of input transistors, and a first pair of cascoded transistors each coupled to a respective one of the corresponding input transistors. The transistors are preferably MOS transistors fabricated in accordance with CMOS technology.

Preferably, each switch mechanism comprises a plurality of switches including first and second switches each coupled between a drain and source of a respective one of the input transistors, and a third switch coupled between the drains of the input transistors.

In accordance with another aspect of the invention, a method of forming such an amplifier is provided.

In accordance with a further aspect of the invention, a magnetic storage medium is provided. Such a storage medium comprises a disk drive comprising a hard disk controller, and a read channel in communication with the hard disk controller. The output of a pre-amplifier is supplied to the read channel. The pre-amplifier comprises a plurality of amplification stages having at least one common output node, and a switch mechanism for each stage that controls the gain of that stage. The switch mechanisms are selectively controllable to vary the gain of the pre-amplifier while maintaining substantially constant bandwidth.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1A is a schematic diagram of a conventional single-stage, variable gain amplifier.

FIG. 1B is a schematic diagram of another conventional single-stage, variable gain amplifier.

FIGS. 2A, 2A-1, 2A-2 and 2B are schematic diagrams of various components of a constant bandwidth, variable gain amplifier, constructed in accordance with embodiments of the invention.

FIGS. 3A and 3B are magnitude response graphs of an amplifier of the present invention at high and low gains respectively, each for a plurality of different programmed gains.

FIG. 4A is a functional block diagram illustrating various components in a disk drive system including a pre-amplifier in which the amplifier of FIG. 2 is adapted to be embodied.

FIG. 4B is a more detailed functional block diagram of the pre-amplifier of FIG. 4A.

DETAILED DESCRIPTION OF THE INVENTION

Referring to FIGS. 2A and 2B, schematic diagrams of components of a multi-stage, constant bandwidth, variable gain amplifier 30, constructed in accordance with embodiments of the invention, are illustrated. As shown in FIG. 2A, amplifier 30 has a plurality of stages and may be powered by a power supply designated $V_{supply}$. The power supply may be, for example, 3.3 V or 5.0 V and may include a built-in internal regulator. Amplifier 30 is primarily comprised of a plurality of FETs, preferably MOSFETs. A pair of resistors R31 and R32 are interposed between the $V_{supply}$ node and various active components of the amplifier.

Each of the n stages includes a pair of matched NMOS input transistors MN3n1 and MN3n2 for receiving a differential input signal represented by the difference between input voltage signals INP and INM respectively. Input transistors MN3n1 and MN3n2 are biased with a current source transistor MN3n0, the drain of which is coupled to the common source node of the corresponding input transistors. The gate of each of the current source transistors MN3n0 is biased by a voltage control signal BIAS1. The source of each transistor MN3n0 is coupled to a common node VSS which may grounded or coupled to a second power supply.

Each pair of input transistors is cascoded with a pair of NMOS transistors MN3n3 and MN3n4, as shown in FIG. 2A, which are controlled by a common voltage control signal BIAS2 that is applied to the gate of each cascoded transistor.

Each of the n stages also includes a pair of PMOS transistors MP3n5 and MP3n6, the drains of which are respectively coupled to the drains of input transistors MN3n1 and MN3n2. The source of each of these transistors is coupled to the $V_{supply}$ node. Each of these transistors MP3n5 and MP3n6 is controlled by a common voltage control signal BIAS3. These PMOS transistors reduce the size of the cascoded transistors MN3n3 and MN3n4.

Each of the n stages shares a first common output node (i.e., the drain node of transistors MN3n3) that carries an output signal RX. Each of the n stages also has a second common drain node (i.e., the drain node of transistors MN3n4) that carries an output signal RY. Thus, the output signals generated at each stage are respectively combined with the corresponding output signals produced by the other stages to generate RX and RY which represent the output signals for the amplifier as a whole.

As shown in FIG. 2B, each stage of amplifier 30 includes a switch mechanism, designated by the reference character Sn50, as shown in FIG. 2B. In the illustrated embodiment, each switch mechanism includes a group of three switches: a first switch which is comprised of a transistor NGN3n1 coupled between the drain and source of input transistor MN3n1, a second switch which is comprised of a transistor NGN3n2 coupled between the drain and source of input transistor MN3n2, and a third switch which is comprised of a transistor NGN3n3 coupled between the drains of the two input transistors in that stage. The connection nodes of each switch mechanism in the corresponding amplification stage are labelled 3n0, 3n1 and 3n2 in FIGS. 2A and 2B.

Each group of switches is separately controlled, but the switches in a particular group are synchronously controlled to adjust the overall gain of the amplifier by individually controlling the gain of each stage. In particular, the gates of the transistors that comprise switch mechanism S150 are controlled by a first voltage control signal SPD2, the gates of the transistors that comprise switch mechanism S250 are controlled by a second voltage control signal SPD1, and the gates of the transistors that comprise switch mechanism Sn50 are controlled by an $n^{th}$ voltage control signal SPD0.

With this arrangement, all of the switches in a particular group are either "on" or "off," depending on the corresponding voltage control signal. When the switches in a particular group are "off" that stage produces a gain which is added to the overall gain of the amplifier. However, when the switches in a particular group are "on," the drains and sources of the input transistors in the corresponding stage are shorted so that no gain is produced by that stage. Thus, with this arrangement, the overall gain of the amplifier can be controlled by selectively setting each group of switches.

For example, in a three-stage amplifier, where each of the stages produces a gain $A_1$, $A_2$ and $A_3$ respectively, the total gain of the amplifier A is equal to $A_1C_1+A_2C_2+A_3C_3$, where $C_1$, $C_2$ and $C_3$ represent a one-bit value (i.e., 0 or 1) that indicates whether the switches in the corresponding stage are on or off. The transistors and passive components in each stage may be sized so that $A_1$, $A_2$ and $A_3$ are equal, in which case the gain is controllable in increments of the stage gain. In the case where all of the individual stage gains are equal, more stages may be provided to increase the gain range. Increasing the number of stages and decreasing the stage gain provides more precise control of the overall gain over a wider gain range.

In another embodiment, the stages may be constructed so that the stage gains are not all equal. Such a construction can be employed to provide a desired precision of control over a desired gain range without unduly increasing the number of stages.

An advantage of such individually controllable switch mechanisms is that they provide a programmable gain with constant speed without degrading the bandwidth of the amplifier. When a particular group of switches are "off," the corresponding stage generates a normal gain. Also, when a particular group of switches are "off," the corresponding cascoded transistors MN3n3 and MN3n4 isolate the drain nodes of the input transistors from the output nodes, which reduces the drain junction parasitic capacitances on the output nodes to a low and relatively constant level, to improve speed performance. Turning on switches NGN3n1 and NGN3n2 causes nearly all of the current that would otherwise flow through transistors MN3n1 and MN3n2 to flow through those switches, so that those transistors operate in the linear region. Thus, there is almost no AC current from transistors MN3n1 and MN3n2. Closing switch NGN3n3 makes the common drain node of the input transistors a common-mode voltage node.

FIGS. 3A and 3B graphically illustrate magnitude responses of an exemplary 2-bit programmable gain amplifier, constructed in accordance with the invention, at high and low gains respectively. The amplifier has four different gains determined by the number of stages generating a normal gain, which, in turn, is controlled by the different bit settings.

In the high gain mode, shown in FIG. 3A, bit settings 11, 10, 01 and 00 correspond to responses 51, 52, 53 and 54 respectively. The gain, −1 dB bandwidth (BW) and −3 dB BW for each of these responses is set forth in the table below.

| Bit Setting | Gain | −1 dB BW (MHz) | −3 dB BW (MHz) |
|---|---|---|---|
| 11 | 252 | 666 | 778 |
| 10 | 202 | 674 | 780 |
| 01 | 148 | 676 | 781 |
| 00 | 100 | 684 | 790 |

Thus, while the gain ranges from 100 to 252, the −1 dB BW drops less than 2.7% from its high at the 00 bit setting. The −3 dB BW is even more constant; it drops less than 1.6% from its high.

In the low gain mode, shown in FIG. 3B, bit settings 11, 10, 01 and 00 correspond to responses 55, 56, 57 and 58 respectively. The gain, −1 dB bandwidth (BW) and −3 dB BW for each of these responses set forth in the table below.

| Bit Setting | Gain | −1 dB BW (MHz) | −3 dB BW (MHz) |
|---|---|---|---|
| 11 | 190 | 674 | 778 |
| 10 | 152 | 682 | 786 |
| 01 | 111 | 683 | 788 |
| 00 | 75 | 692 | 796 |

As can be seen, the bandwidth remains substantially constant through a gain range from 75 to 190. The −1 dB BW drops less than 2.7% from its high at the 00 bit setting, and the −3 dB BW drops less than 2.3% from its high.

As previously noted, amplifier 30, which provides programmable gain with substantially constant bandwidth, may be advantageously used in connection with magnetic storage medium applications, and in particular disk drive applications. FIG. 4A is a functional block diagram of a disk drive system 60. The system includes a disk drive 61 that may be of a 2-, 4- or 8-channel configuration. The disk drive is comprised of a hard disk controller (HDC) 62 that interfaces with a host device, such as a host computer 63, and further includes a microprocessor 64 and memory 65, each in communication with the HDC. A motor driver 66 is also provided. Disk drive 61 also includes a read channel 67, the output of which is supplied to the HDC. A pre-amplifier integrated circuit 68 generates an output signal which is supplied as an input to the read channel. The pre-amplifier is in communication with a recording head 69, which may be a Magneto-Resistive (MR) or Giant Magneto-Resistive (GMR) recording head.

As illustrated in FIG. 4B, the pre-amplifier includes a low noise gain stage 71 which generates a signal in the range of about 30 dB to about 50 dB. The output of this stage is supplied to another gain stage 72 in which amplifier 30 is embodied. By employing amplifier 30, gain stage 72 is able to provide an amplified signal with minimum noise corruption at substantially constant bandwidth to the read channel. Pre-amplifier 68, including amplifier 30, is preferably manufactured with reliable and cost effective CMOS technology.

It should be readily apparent from the foregoing description that the present invention provides an amplifier that maintains a substantially constant bandwidth, as the gain is varied. Such an amplifier may be advantageously employed in connection with a magnetic storage medium to provide a higher quality amplified signal to the read channel for further processing.

While the invention has been described in conjunction with specific embodiments, many further alternatives, modifications, variations and applications will be apparent to those skilled in the art in light of the foregoing description. Thus, the invention described herein is intended to embrace all such alternatives, modifications, variations and applications as may fall within the spirit and scope of the appended claims.

What is claimed is:

1. An amplifier, comprising:
    a plurality of amplification stages having at least one common output node; and
    a switch mechanism for each stage that controls the gain of that stage;
    wherein the switch mechanisms are selectively controllable to vary the gain of the amplifier while maintaining substantially constant bandwidth,
    wherein each amplification stage includes a first pair of input transistors, and a first pair of cascoded transistors each coupled to a respective one of the corresponding input transistors.

2. The amplifier of claim 1, wherein each switch mechanism comprises a plurality of switches including first and second switches each coupled between a drain and source of a respective one of the input transistors.

3. The amplifier of claim 2, wherein each switch mechanism further comprises a third switch coupled between the drains of the input transistors.

4. The amplifier of claim 1, wherein each amplification stage is comprised of MOS transistors fabricated in accordance with CMOS technology.

5. An amplifier, comprising:
    a first amplification stage comprising
        a first pair of input transistors,
        a first pair of cascoded transistors each coupled to a respective one of the first pair of input transistors, and
        a first switch mechanism that controls the gain of the first amplification stage; and
    a second amplification stage comprising
        a second pair of input transistors,
        a second pair of cascoded transistors each coupled to a respective one of the second pair of input transistors, and
        a second switch mechanism that controls the gain of the first amplification stage;
    wherein the first and second amplification stages have at least one common output node, and wherein the first and second switch mechanisms are selectively controllable to vary the gain of the amplifier while maintaining substantially constant bandwidth.

6. An amplifier, comprising:
    a plurality of means for amplifying an input signal to the amplifier, each of the means having at least one common output node; and
    means, associated with each stage, for controlling the gain of that stage;
    wherein the controlling means are selectively controllable to vary the gain of the amplifier while maintaining substantially constant bandwidth,
    wherein each means for amplifying includes a first pair of input transistors, and a first pair of cascoded transistors each coupled to a respective one of the corresponding input transistors.

7. The amplifier of claim 6, wherein each amplifying means includes means for receiving the input signal, and means for generating an output signal.

8. The amplifier of claim 7, wherein each of the controlling means further comprises a plurality of means for controlling electrical characteristics of the corresponding amplifying means.

9. The amplifier of claim 6, wherein each amplification means is fabricated in accordance with CMOS technology.

10. A method of forming an amplifier, comprising:
fabricating a plurality of amplification stages having at least one common output node;
fabricating a switch mechanism for each stage that controls the gain of that stage;
wherein the switch mechanisms are selectively controllable to vary the gain of the amplifier while maintaining substantially constant bandwidth; and
providing each amplification stage with a first pair of input transistors, and a first pair of cascoded transistors each coupled to a respective one of the corresponding input transistors.

11. The method of claim 10, further comprising providing each switch mechanism with a plurality of switches including first and second switches each coupled between a drain and source of a respective one of the input transistors.

12. The method of claim 11, further comprising providing each switch mechanism with a third switch coupled between the drains of the input transistors.

13. The method of claim 10, further comprising providing each amplification stage with a plurality MOS transistors in accordance with CMOS technology.

14. A magnetic storage medium, comprising:
a disk drive comprising
a hard disk controller, and
a read channel in communication with the hard disk controller; and
a pre-amplifier in communication with the read channel, the pre-amplifier comprising
a plurality of amplification stages having at least one common output node; and
a switch mechanism for each stage that controls the gain of that stage;
wherein the switch mechanisms are selectively controllable to vary the gain of the pre-amplifier while maintaining substantially constant bandwidth,
wherein each amplification stage includes a first pair of input transistors, and a first pair of cascoded transistors each coupled to a respective one of the corresponding input transistors.

15. The magnetic storage medium of claim 14, wherein each switch mechanism comprises a plurality of switches including first and second switches each coupled between a drain and source of a respective one of the input transistors.

16. The magnetic storage medium of claim 15, wherein each switch mechanism further comprises a third switch coupled between the drains of the input transistors.

17. The magnetic storage medium of claim 14, wherein each amplification stage is comprised of MOS transistors fabricated in accordance with CMOS technology.

18. An amplifier, comprising:
first amplification means comprising
first input means for receiving an input signal,
first cascoded means coupled to the first input means, and
first switch means for controlling the gain of the first amplification means; and
second amplification means comprising
second input means for receiving the input signal,
second cascoded means coupled to the second input means, and
second switch means for controlling the gain of the second amplification means;
wherein the first and second amplification means have at least one common output node, and wherein the first and second switch means are selectively controllable to vary the gain of the amplifier while maintaining substantially constant bandwidth.

19. A magnetic storage medium, comprising:
disk drive means comprising
means for controlling a hard disk, and
read channel means for generating a first output signal and transmitting the first output signal to the hard disk controlling means; and
a pre-amplifier for generating a second output signal and transmitting the second output signal to the read channel means, the pre-amplifier comprising
a plurality of means for amplifying an input signal to the preamplifier, each of the means having at least one common output node; and
means, associated with each stage, for controlling the gain of that stage;
wherein the controlling means are selectively controllable to vary the gain of the pre-amplifier while maintaining substantially constant bandwidth,
wherein each means for amplifying includes a first pair of input transistors, and a first pair of cascoded transistors each coupled to a respective one of the corresponding input transistors.

20. The magnetic storage medium of claim 19, wherein each amplifying means includes means for receiving the input signal.

21. The magnetic storage medium of claim 20, wherein each of the controlling means further comprises a plurality of means for controlling electrical characteristics of the corresponding amplifying means.

22. The magnetic storage medium of claim 19, wherein each amplification means is comprised of MOS transistors fabricated in accordance with CMOS technology.

* * * * *